United States Patent [19]

Sly

[11] 3,970,968
[45] July 20, 1976

[54] SIGNAL MODULATOR APPARATUS

[75] Inventor: Thomas L. Sly, Clay, N.Y.

[73] Assignee: Anaren Microwave, Incorporated, Syracuse, N.Y.

[22] Filed: Jan. 30, 1975

[21] Appl. No.: 545,378

[52] U.S. Cl. .......................... 332/37 D; 332/31 T; 332/52
[51] Int. Cl.² ........................................ H03C 1/14
[58] Field of Search ............ 332/31 R, 31 T, 37 R, 332/37 D, 38, 52; 307/264, 317, 310; 328/3

[56] References Cited
UNITED STATES PATENTS

| | | | |
|---|---|---|---|
| 3,510,567 | 5/1970 | Fisher | 332/31 T X |
| 3,560,995 | 2/1971 | Zielinski et al. | 307/310 X |
| 3,701,004 | 10/1972 | Tuccinardi et al. | 307/310 X |
| 3,713,034 | 1/1973 | Schwartz | 307/264 X |
| 3,814,957 | 6/1974 | Way | 328/3 X |

*Primary Examiner*—John Kominski
*Attorney, Agent, or Firm*—Hane, Baxley & Spiecens

[57] ABSTRACT

Signal modulation apparatus includes a PIN diode network which is fed a carrier signal from a carrier signal source and a modulation signal from modulating current output terminal which receives a modulation current directly from a temperature-compensated constant-current amplifier and a signal via a unity gain amplifier from a reference diode which is also fed from the constant-current amplifier which is adapted to receive a modulating signal.

7 Claims, 1 Drawing Figure

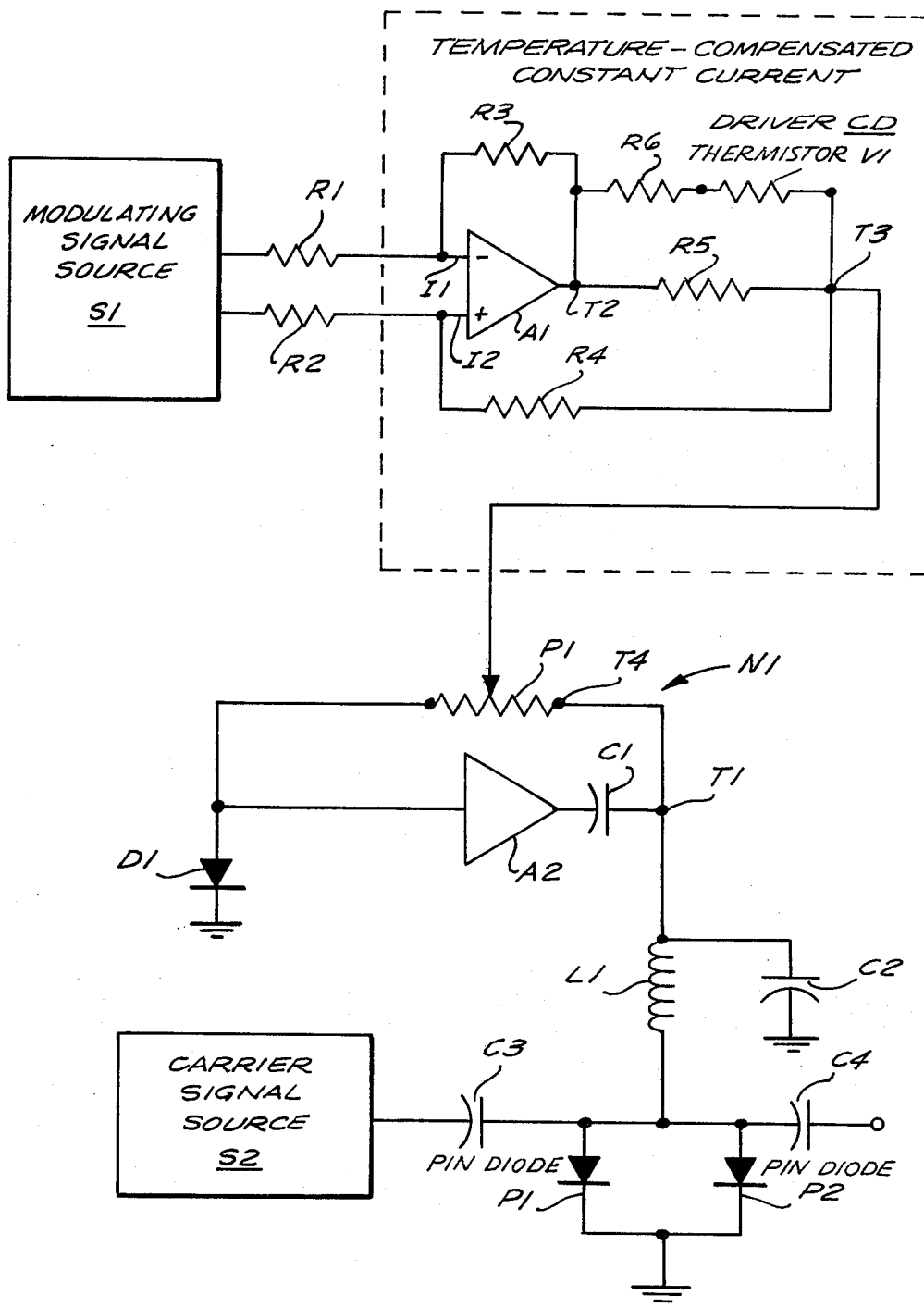

SIGNAL MODULATOR APPARATUS

This invention pertains to signal modulation apparatus.

A basic limitation exists in the design of a PIN diode modulators regarding modulation rate or frequency of modulation depending on the effective minority lifetime of the PIN diode and the impedance of the modulation drive source. The effective minority lifetime of the PIN diodes must have a minimum value set by the RF frequency and power level to be modulated. The only other variable is the drive impedance of the modulation drive source.

Best temperature performance can be obtained with constant current (infinite impedance) drive when the current is adjusted as a direct function of degrees Kelvin to maintain a fixed attentuation. Highest modulation rate is achieved by using voltage drive (zero impedance) and temperature under this circumstance must be adjusted by offsetting the drive by about $-2.35$ MV/C°. To do this accurately is much more difficult than the current drive temperature correction system.

It is accordingly a general object of the invention to provide improved signal modulation apparatus.

It is another object of the invention to provide such modulation apparatus which has higher modulation rates than usually achievable with PIN diodes.

It is a further object of the invention to provide such modulation apparatus which has improved performance in the face of varying ambient temperatures.

It is still another object of the invention to provide modulation apparatus which combines both the temperature performance of constant current drivers and the high modulation rates of voltage drivers.

Briefly, one aspect of the invention contemplates a variable impedance modulating signal driver having a temperature compensated constant-current amplifier which is adapted to receive the modulating signal and in response thereto feed a modulating current in parallel to a modulating current output terminal and to a grounded reference diode while the ungrounded terminal of the diode is A.C. coupled to the modulating current output terminal so that the changing voltage waveform across the reference diode is also fed to the modulating current output terminal.

A feature of the invention contemplates the connection of a PIN diode acting as a modulating element to the modulating current output terminal.

A further feature of the invention contemplates, in addition to the use of the PIN diodes, the connection of a carrier signal source to the modulating current output terminal to provide a complete carrier modulation system.

Other objects, features and advantages of the invention will be apparent from the following detailed description of the invention when read with the accompanying drawing whose sole FIGURE shows a modulation system incorporating the invention.

The modulating system comprises a modulator in the form of PIN diodes P1 and P2 coupled via coupling capacitor C3 to carrier signal source S2 and via the decoupling network including series inductor L1 and shunt capacitor C2 to the modulating signal output terminal T1 of a variable impedance modulating signal driver. The driver comprises a signal combining circuit N1 which is driven from a temperature-compensated constant current driver CD in response to modulating signal source S1. Since modulating signal source S1 and carrier signal source S2 are conventional devices they will not be discussed any further, except to state that carrier signal source S2 supplies the carrier signal either in the megahertz or gigahertz range upon which the information contained in the modulating signal from modulating signal source S1 is impressed.

Driver CD comprises operational amplifier A1 having differential inputs I1 and I2 connected via resistors R1 and R2 respectively to the outputs of modulating signal source S1. The output of amplifier A1 is connected to terminal T2 which is connected via a resistor network to terminal T3. A feedback resistor R3 connects terminal T2 to the input I1 and a feedback resistor R4 connects terminal T3 to the input I2. The resistor network has a first branch consisting of fixed resistor R5 and a second branch parallel thereto consisting of resistor R6 and temperature sensitive resistor (thermistor) V1. Because of the feedback and the differential inputs, the amplifier A1 strives to produce a null at the inputs I1 and I2. The result is that the voltage drop across terminals T2 and T3 is maintained constant. However, as the ambient temperature rises, the resistance of the thermistor V1 decreases and consequently the resistance of the resistor network. Since the voltage across the terminals T2 and T3 is to remain constant more current is delivered from the amplifier A1. In this manner the temperature compensation is obtained. In addition, for any given temperature and for any given amplitude of the input signal to amplifier A1, the current delivered from terminal T3 remains constant regardless of the load connected to terminal T3. For example, if the load starts drawing more current, the voltage across the terminals T2 and T3 will rise since the resistance between the terminals is constant. Amplifier A1 senses this increase in voltage at its inputs because the null is disturbed and therefore amplifies less, causing the current from the amplifier to drop its normal value. In this sense the driver CD is a constant current driver. Note, it does not preclude the amplifier from delivering a current which follows the input signal from source S1. This current is the modulating current which is fed via modulating signal output terminal T3 to signal combining circuit N1.

Circuit N1 comprises a potentiometer P1 whose wiper or variable tap is connected to terminal T3 and whose resistor has one end connected to modulating signal output terminal T1 and the other end connected via reference diode D1 to ground. In addition, the junction of diode D1 and the potentiometer is connected to the input of unity gain amplifier A2 having a high input impedance and a low output impedance. The output of amplifier A2 is A.C. coupled via coupling capacitor C1 to terminal T1. Diode D1 is connected so that its polarity conforms with the polarity of the PIN diodes P1 and P2, i.e., each have their same terminals grounded, for example, as shown all the diodes have their cathodes grounded. In addition, the reference diode has a current vs. voltage characteristic which matches that of the PIN diodes. In addition, the reference diode must have a shorter effective minority lifetime than that of the PIn diodes. While any shorter lifetime will improve the response, practical considerations dictate a lifetime of at least ten times and preferable over a hundred times shorter.

Thus, the modulating current fed to the PIN diodes has two components: a component fed directly from constant current driver CD via the terminal T4 of potentiometer P1 to provide the proper operating point (fixed R.F. operating point vs. temperature) for the PIN diodes; and a component from amplifier A2 which forces the dynamic attenuation of the PIN diodes to exactly and immediately follow the modulating signal from source S1.

This technique insures a critically damped step function in the resultant attenuation of the PIN diodes with no overshoot anywhere in the dynamic range of the system. In addition, faster modulation rates are obtainable. Presently, typical modulation transition times are from 10 to 20 times the effective minority carrier lifetime whereas with the invention transition times as low as one-third such lifetime are obtained.

While only one embodiment of the invention has been shown and described in detail, there will now be obvious to those skilled in the art many modifications and variations satisfying many or all of the objects of the invention without departing from the spirit thereof as defined by the appended claims.

What is claimed is:

1. Apparatus for use in signal modulators comprising: a constant current amplifier having temperature compensating means, an input adapted to receive a modulating signal and an output for transmitting a temperature-compensated modulating current; a reference diode having first and second terminals first connecting means for connecting a first terminal of said reference diode to the output of said constant current amplifier; grounding means for signal grounding the second terminal of said reference diode; a modulating current output terminal; second connecting means for connecting the output of said constant current amplifier to said modulating current output terminal; a signal amplifier with unity gain and a coupling capacitor connected in series; and means for connecting the first terminal of said reference diode via the series circuit of said signal amplifier and coupling capacitor to said modulating current output terminal.

2. The signal modulation apparatus of claim 1 wherein said first and second connecting means comprise a potentiometer having a variable tap connected to the output of said constant current amplifier and having a resistor with a first end connected to the first terminal of said reference diode and a second end connected to said modulating current output terminal.

3. The apparatus of claim 1 wherein said signal amplifier has a high input impedance and a low output impedance.

4. The apparatus of claim 1 further comprising modulating means having a modulating signal input connected to said modulating current output terminal, a carrier signal input and a modulated signal output, and a carrier signal source connected to said carrier signal input.

5. Signal modulation apparatus comprising; a source of modulating signals; a constant current amplifier having temperature compensating means, an input connected to said source of modulating signals and an output for transmitting a temperature compensated modulating current, a reference diode having first and second terminals; first connecting means for connecting a first terminal of said reference diode to the output of said constant current amplifier; grounding means for signal grounding the second terminal of said reference diode; a modulating current output terminal; second connecting means for connecting the output of said constant current amplifier to said modulating current output terminal; AC connecting means for AC connecting the first terminal of said reference diode to said modulating current output terminal; a PIN diode having a first terminal connected to said modulating current output terminal and a second terminal connected to ground; and a carrier signal source connected to the first terminal of said PIN diode.

6. The signal modulating apparatus of claim 5 wherein said A.C. coupling means comprises a signal amplifier with unity gain and a coupling capacitor connected in series.

7. The signal modulating apparatus of claim 5 wherein said A.C. coupling means comprises a unity gain amplifier with a high input impedance and a low output impedance and having an input connected to the first terminal of said reference diode and an output and a coupling capacitor connecting the output of said unity gain amplifier to said modulating current output terminal; and wherein said first and second connecting means comprise a potentiometer having a variable tap connected to the output of said constant current amplifier and having a resistor with a first end connected to the first terminal of said reference diode and a second end connected to said modulating current output terminal whereby the ratio of the currents transmitted to said reference diode and said modulating current output terminal can be controllably varied.

* * * * *